United States Patent [19]
Huang

[11] Patent Number: 6,077,789
[45] Date of Patent: Jun. 20, 2000

[54] METHOD FOR FORMING A PASSIVATION LAYER WITH PLANARIZATION

[75] Inventor: Chien-Chung Huang, Taichung Hsien, Taiwan

[73] Assignee: United Microelectronics Corp., Hsinchu, Taiwan

[21] Appl. No.: 09/172,535

[22] Filed: Oct. 14, 1998

[30] Foreign Application Priority Data

Jul. 14, 1998 [TW] Taiwan .................................. 87111388

[51] Int. Cl.[7] .................................................. H01L 21/00
[52] U.S. Cl. .......................... 438/720; 438/734; 438/742; 438/754
[58] Field of Search ..................................... 438/720, 734, 438/742, 750, 754, 691, 692, 697; 216/38, 67, 75, 88, 100

[56] References Cited

U.S. PATENT DOCUMENTS 4,352,724  10/1982  Sugishima et al. ................. 438/754 X
4,986,877  1/1991   Tachi et al. ........................ 438/734 X

*Primary Examiner*—William Powell
*Attorney, Agent, or Firm*—Thomas, Kayden, Horstemeyer & Risley

[57] ABSTRACT

A method for forming a passivation layer with improved planarity includes patterning a top interconnect metal layer through two steps of etching, in which the metal layer is formed over a substrate that has device elements already formed thereon. The first etching process is isotropic etching, which undercuts an etching mask layer. The upper sharp corners of the metal layer are removed. The second etching process in anisotropic etching to complete an opening that exposes the substrate. A PSG layer and a silicon nitride layer are sequentially formed to serve as a passivation layer. Since the aspect ratio is reduced due to undercutting, a void within the opening is avoided, and a crack in the passivation layer within the opening is also avoided.

17 Claims, 3 Drawing Sheets

6,077,789

METHOD FOR FORMING A PASSIVATION LAYER WITH PLANARIZATION

CROSS-REFERENCE TO RELATED APPLICATION

This application claims the priority benefit of Taiwan application Ser. No. 87111388, filed Jul. 14, 1998, the full disclosure of which is incorporated herein by reference.

BACKGROUND OF THE INVENTION

1. Field of the Invention

This invention relates to a semiconductor fabrication, and more particularly to a method for forming a passivation layer formed over an interconnect metal layer whose planarity is improved by properly patterning the interconnect metal layer before forming the passivation layer.

2. Description of Related Art

In semiconductor fabrication, an integrated circuit (IC) device is formed over a semiconductor substrate. The IC device usually includes, for example, transistors and capacitors, which are interconnected by an interconnect metal layer. After the structure of the IC device is formed, a passivation layer then is formed over the IC structure so as to protect the IC device from external damages. In order to effectively protect the IC structure, the passivation layer must be uniformly deposited, have no voids and sufficient hardness, and be able to resist cracking, penetration of water vapor or alkaline ions, and mechanical damages.

Some common materials for forming the passivation layer include silicon nitride or phosphosilicate glass (PSG). The silicon nitride material has a high density and a great hardness so that silicon nitride can effectively resist the penetration of water vapor or alkaline ions and resist mechanical damages. The PSG material includes phosphoric atoms, which have a gettering property so that the water vapor and alkaline ions are effectively absorbed by it. The lifetime of the IC device thereby is prolonged.

FIGS. 1A–1D are cross-sectional views of a semiconductor device schematically illustrating a conventional fabrication process for forming a passivation layer over a semiconductor substrate.

In FIG. 1A, a metal layer 12 is formed over a semiconductor substrate 10. The substrate 10 includes a structure of an IC device, such as a metal-oxide semiconductor (MOS) transistor, a dielectric layer, and an interconnect metal layer with a proper couplings, all of which structures are not shown in the figure. The metal layer 12 includes aluminum or aluminum alloy. The metal layer 12 is the top interconnect metal layer in the IC device. A photoresist layer 14 with a desired pattern is formed over the metal layer 12.

In FIG. 1B, using the photoresist layer 14 as an etching mask, the metal layer 12 is patterned to form a metal layer 12a through an etching process such as dry etching. An opening 15 is thereby formed in the metal layer 12a to expose the substrate 10. The opening 15 on the side is wider and is not fully shown. The photoresist layer 14 of FIG. 1 is removed. The metal layer 12a has several sharp corners 13 on each side edge due to the formation of the opening 15. The sharp corners 13 affect the planarity of a passivation layer that is to be subsequently formed.

In FIG. 1C, a PSG layer 16 is formed over the substrate 10 through atmospheric chemical vapor deposition (APCVD) or low pressure chemical vapor deposition (LPCVD). The PSG layer 16 is conformal to the metal layer 12a. The PSG layer 16 servers as a first passivation layer to protect the IC device from penetration of water vapor or alkaline ions. Referring to FIG. 1B and FIG. 1C, when the PSG material is deposited over the substrate 10, the growing rate of the PSG layer 16 on the bottom of the opening 15 is less than the growing rate at the sharp corners 13, due to the structure of the sharp corners 13. A little overhang structure 17 occurs on the sharp corners 13. The step coverage over the opening 15 is not sufficient.

In FIG. 1D, a dielectric layer 18 is formed over the substrate 10. The dielectric layer 18 includes silicon nitride with high density and great hardness. The dielectric layer 18 serves as a second passivation layer to protect the IC device below the passivation layer. Due to the overhang structure 17 in the PSG layer 16, it is difficult to deposit the dielectric layer 18. The step coverage is worsened. A void 21 is formed in the dielectric layer 18 due to the large aspect ratio, in which the aspect ratio is defined as the ratio of the depth to the width of an opening. The dielectric layer 18 also has an acute angle structure 19 at the lower corner of the metal layer 12a within the wider side openings 15 shown in FIG. 1B. At the acute angle structure 19, a crack may easily occur. The formation of the acute angle structure 19 also results from the overhang structure 17 in the PSG layer 16, which causes a higher depositing rate on the upper outer corner of the metal layer 12a. The overhang phenomenon is worsened.

In conclusion, the conventional method for forming the passivation layer lacks sufficient planarity, and has a void in the opening and a crack at the acute angle structure 19.

SUMMARY OF THE INVENTION

It is therefore an objective of the present invention to provide an improved method for forming a passivation layer with better planarity by reducing the aspect ratio of an opening.

It is another objective of the present invention to provide an improved method for forming a passivation layer that prevents a void from occurring within an opening.

It is still another an objective of the present invention to provide an improved method for forming a passivation layer to prevent a crack from occurring at the lower corner of a metal layer.

In accordance with the foregoing and other objectives of the present invention, an improved method for forming a passivation layer is provided. The method includes first forming a metal layer over a semiconductor substrate. The metal layer serves as a top interconnect metal layer of an IC device formed on the substrate. A photoresist layer with a desired pattern is formed over the substrate to serve as an etching mask. An isotropic etching process is performed to etch only a portion of the metal layer. An anisotropic etching process is subsequently performed to form an opening, which exposes the substrate. The photoresist layer is removed. A first dielectric layer is formed over the substrate and is conformal to the substrate. An overhang phenomenon does not occur due to the isotropic etching. A second dielectric layer is formed over the first dielectric layer and fills the opening. The first dielectric layer and the second dielectric layer serve as the passivation layer.

In the foregoing, the isotropic etching including, for example, wet etching undercuts the metal layer below the etching mask to remove several sharp corners, which are just below the etching mask at mask's edges. The width of the opening at the upper portion is thereby enlarged so that the aspect ratio is reduced. This allows a better step coverage performance. A void in the opening is avoided. An acute angle structure on the lower corners of the patterned metal layer within the opening is also avoided if the width of the opening is too large. This gives an advantage that a crack is prevented from occurring therein.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
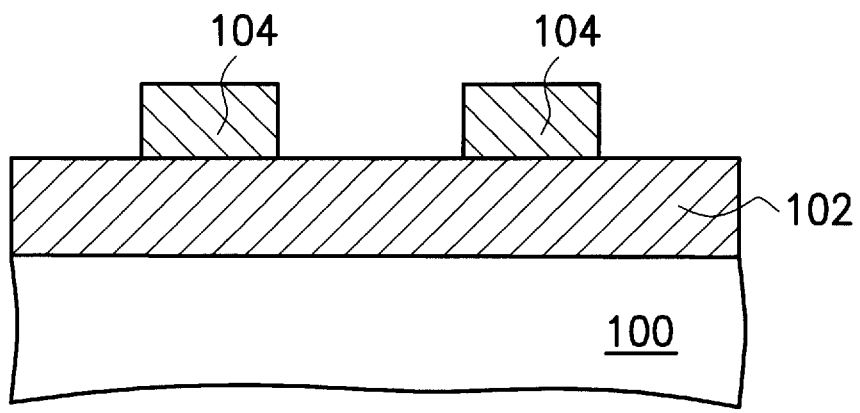
FIGS. 2A–2E are cross-sectional views of a semiconductor device schematically illustrating steps taken in a fabrication process for forming a passivation layer over a semiconductor substrate, according to a preferred embodiment of the invention.

FIGS. 2A–2E are cross-sectional views of a semiconductor device schematically illustrating steps taken in a fabrication process for forming a passivation layer over a semiconductor substrate, according to a preferred embodiment of the invention. In FIG. 2A, a metal layer 102 is formed over a semiconductor substrate 100. The substrate 100 includes a structure of an IC device, such as a metal-oxide semiconductor (MOS) transistor, a dielectric layer, and an interconnect metal layer with a proper couplings, all of which structures are not shown in the figure. The metal layer 102 includes, for example, aluminum or aluminum alloy. The metal layer 102 is, for example, the top interconnect metal layer in the IC device. A photoresist layer 104 with a desired pattern is formed over the metal layer 102.

Figure 1A:
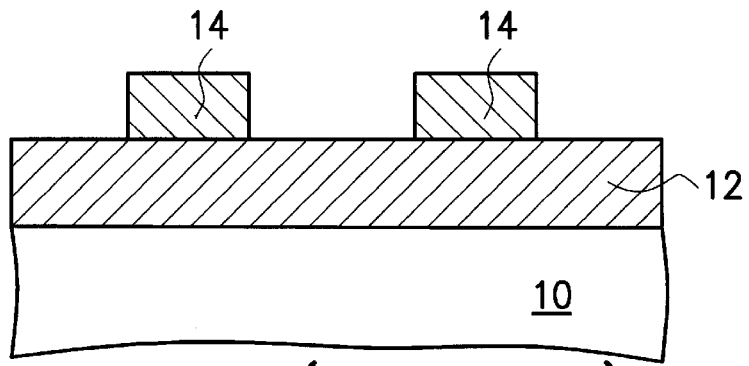
FIGS. 1A–1D are cross-sectional views of a semiconductor device schematically illustrating steps taken in a conventional fabrication process for forming a passivation layer over a semiconductor substrate.
Figure 1B:
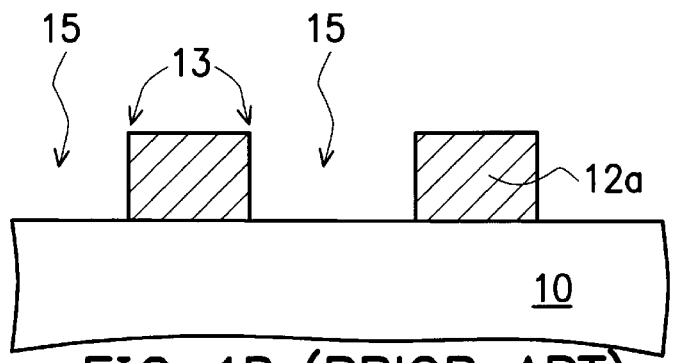
Figure 2B:
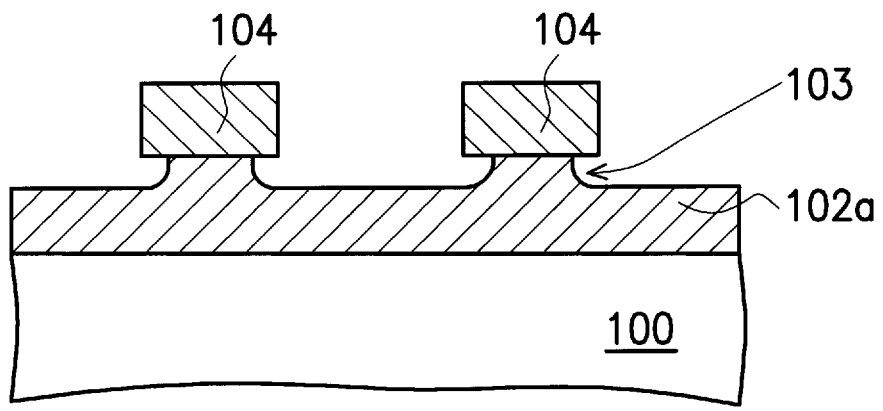

In FIG. 2A and FIG. 2B, using the photoresist layer 104 as an etching mask, two steps of etching processes are performed. First, an isotropic etching process is performed to etch a portion of the metal layer 102. The isotropic etching process preferably includes a wet etching process with etchant that is a mixed acid solution of phosphoric acid and nitride-acid ($H_3PO_4/HNO_3$). The wet etching process undercuts the metal layer 102 at each edge below the photoresist layer 104. The metal layer 102 becomes a metal layer 102a with an undercut structure 103, which removes the original sharp upper corners of the metal layer 102a. The sharp corners 13 shown in FIG. 1B do not occur in FIG. 2B. This is the main characteristic of the invention. Because of this characteristic, the conventional problems are effectively solved, as is to be described below.

Figure 2C:
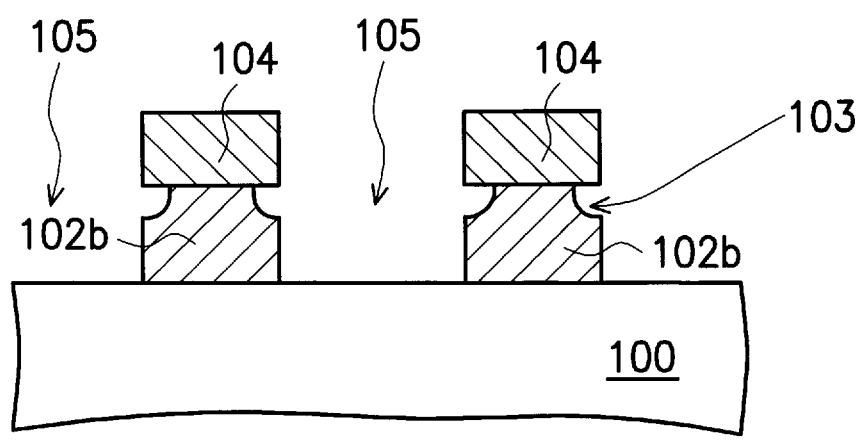

In FIG. 2C, an anisotropic etching process for the second step of etching is performed to etch the metal layer 102a of FIG. 2B. An opening 105 is thereby formed to expose the substrate 100. The metal layer 102a becomes a metal layer 102b. The anisotropic etching process preferably includes a dry etching process with etchant that is a mixed gas of $BCl_3/Cl_2$. The metal layer 102b still carries the undercut structure 103. The opening 105 therefore has a wider width, resulting in a smaller aspect ratio, which is helpful for the subsequent deposition.

Figure 2D:
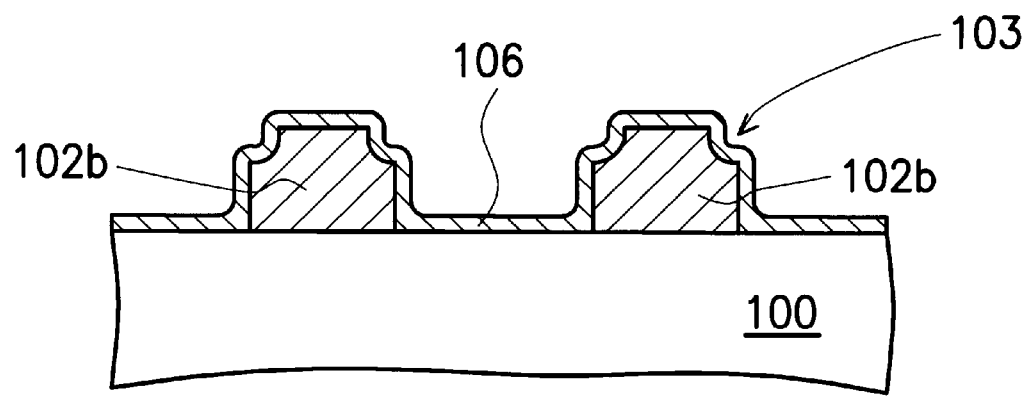

In FIG. 2D, the photoresist layer 104 of FIG. 2C is removed. A PSG layer 106 is formed over the substrate 100, and is conformal to the substrate 100. The PSG layer 106 is formed through, for example, atmospheric chemical vapor deposition (APCVD) or plasma enhanced chemical vapor deposition (PECVD). The PSG layer 106 is to protect the IC device from water vapor and alkaline ions.

Figure 1C:
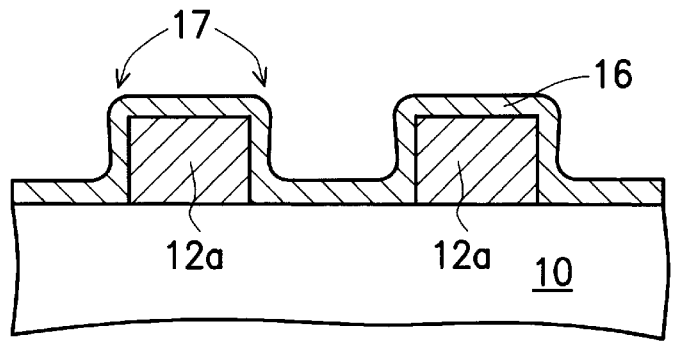

Due to the undercut structure 103, there is no overhang structure like the overhang structure 17 shown in FIG. 1C, and the aspect ratio of the opening 105 of FIG. 2C still remains small. This is very helpful is easing the subsequent deposition.

Figure 2E:
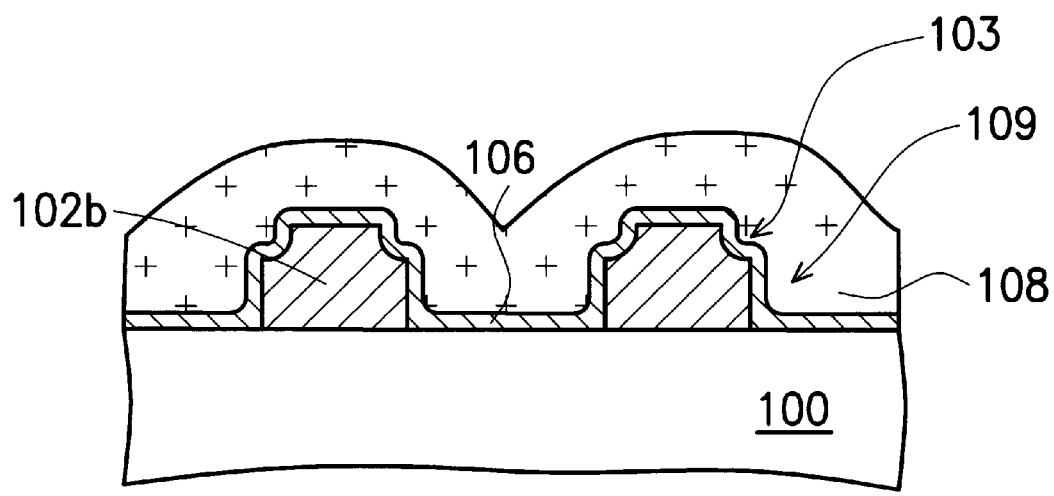

In FIG. 2E, a dielectric layer 108 is formed over the PSG layer 106. The dielectric layer 108 preferably includes silicon nitride because silicon nitride has a high density and hardness. The PSG layer 106 and the dielectric layer 108 serve together as a passivation layer over the substrate 100 for protection.

Figure 1D:
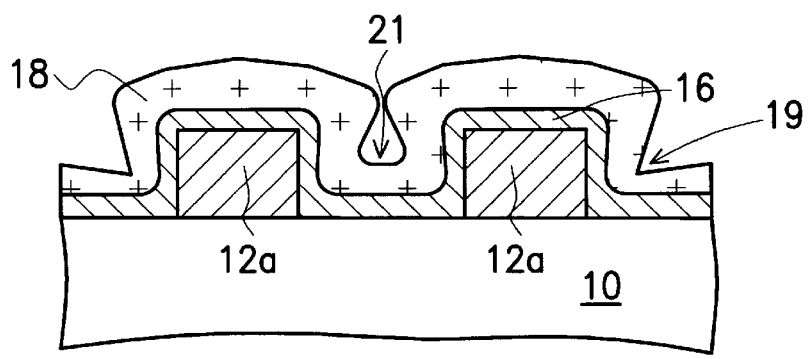

Since the aspect ratio of the opening 105 shown in FIG. 2C is reduced, the silicon nitride deposition is easier to perform. The undercut structure 103 removes the sharp corners so as to avoid the formation of overhang structure and enlarge the width of the opening at the upper portion. The aspect ratio is reduced. The void 21 shown in FIG. 1D does not occur in FIG. 2E. In the conventional process the void occurs when the width of the opening is small. A crack in the dielectric layer 108 is also avoided. For a conventional opening 15 shown in FIG. 1B, the sharp corners 13 are not removed. When the width of the opening 15 is small, a void 21 of FIG. 1D occurs. When the width of the opening 15 is large, a crack at the acute angle structure 19 occurs. All these conventional problems are solved by the invention.

After the process of forming the passivation layer, the processes of forming bonding pad and packaging are further performed to complete the IC chip. The rest of the processes are not further described.

In conclusion, the invention has several characteristics as follows:

1. Th invention includes the first isotropic etching process to etch the metal layer 102 so as to form the undercut structure 103, which removes the sharp corners 13. Then, the second anisotropic etching process is performed to complete the opening 105 so as to have a wider width, which means that a smaller aspect ratio is obtained.

2. Due to the formation of the undercut structure 103, the width of the opening 105 is widened on the top portion through the isotropic etching process so as to reduce the aspect ratio and avoid a formation of an overhang structure on the PSG layer. This strategy can avoid formation of the void 21.

3. The invention avoids occurrence of a crack in the dielectric layer 108 at the acute angle structure 19, which crack exists in the conventional fabrication process.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming a passivation layer with improved planarity, the method comprising:

forming a metal layer over a semiconductor substrate;

forming an etching mask layer over the substrate;

performing an isotropic etching process to etch a portion of the metal layer;

performing an anisotropic etching process to etch the metal layer so as to form an opening in the metal layer to expose the substrate;

removing the etching mask;

forming a first dielectric layer over the substrate, in which the first dielectric layer is conformal to the substrate surface; and forming a second insulating dielectric layer over the first dielectric layer, in which the opening is also filled, wherein the first dielectric layer and the second dielectric layer serve together as the passivation layer.

2. The method of claim 1, wherein the etching mask layer comprises a photoresist layer.

3. The method of claim 1, wherein the isotropic etching process comprises a wet etching process.

4. A method of claim 3, wherein the wet etching process comprises an etchant that is a mixed acid solution of phosphoric acid and nitride acid.

5. The method of claim 1, wherein the anisotropic etching process comprises a dry etching process.

6. The method of claim 5, wherein the dry etching process comprises an etchant that is a mixed gas of $BCl_3/Cl_2$.

7. The method of claim 1, wherein the first dielectric layer comprises phosphosilicate glass (PSG).

8. The method of claim 1, wherein the second dielectric layer comprises silicon nitride.

9. A method for patterning a metal layer for forming a passivation layer with improved planarity, the method comprising:

forming the metal layer over a semiconductor substrate;

forming an etching mask layer over the metal layer;

etching an upper portion of metal layer;

etching a lower portion of the metal layer so as to form an opening in the metal layer to expose the substrate, wherein the size of the lower portion of the metal layer is larger than the size of the upper portion of the metal layer;

forming a conformal layer of phosphosilicate glass on the metal layer and on the exposed substrate; and forming an insulating passivation layer on the conformal layer of phosphosilicate glass to fill the opening.

10. The method of claim 9, wherein the metal layer comprises aluminum.

11. The method of claim 9, wherein the metal layer comprises aluminum alloy.

12. The method of claim 9, wherein the etching mask comprises a photoresist layer.

13. The method of claim 9, wherein the isotropic etching process comprises a wet etching process.

14. The method of claim 13, wherein the wet etching process comprises an etchant that is a mixed acid solution of phosphoric acid and nitride acid.

15. The method of claim 9, wherein the anisotropic etching process comprises a dry etching process.

16. The method of claim 15, wherein the dry etching process comprises an etchant that is a mixed gas of $BCl_3/Cl_2$.

17. A method for forming a passivation layer with improved planarity, the method comprising:

forming the metal layer over a semiconductor substrate;

forming an etching mask layer over the metal layer;

performing an isotropic etching process to etch a upper portion of the metal layer, wherein the isotropic etching process is performed with a mixed acid solution of phosphoric and nitride acid;

performing an anisotropic etching process to etch the metal layer so as to form an opening in the metal layer to expose the substrate, wherein the anisotropic etching process is performed with a mixed gas of $BCl_3$ and $Cl_2$;

forming a conformal layer of phosphosilicate glass on the metal layer and on the exposed substrate; and forming an insulating passivation layer on the conformal layer of phosphosilicate glass to fill the opening.

* * * * *